(12) United States Patent
Arik et al.

(10) Patent No.: US 8,418,934 B2
(45) Date of Patent: Apr. 16, 2013

(54) SYSTEM AND METHOD FOR MINIATURIZATION OF SYNTHETIC JETS

(75) Inventors: Mehmet Arik, Niskayuna, NY (US); Stanton Earl Weaver, Northville, NY (US)

(73) Assignee: General Electric Company, Schenectady, NY (US)

( * ) Notice: Subject to any disclaimer, the term of this patent is extended or adjusted under 35 U.S.C. 154(b) by 979 days.

(21) Appl. No.: 12/198,267

(22) Filed: Aug. 26, 2008

(65) Prior Publication Data

US 2010/0053891 A1 Mar. 4, 2010

(51) Int. Cl.
*B05B 1/08* (2006.01)

(52) U.S. Cl.
USPC .................. 239/102.2; 361/692; 361/697

(58) Field of Classification Search .................. 361/271, 361/277, 278; 239/102.1, 102.2, 546, DIG. 12, 239/556, 557, 562, 563, 564, 566
See application file for complete search history.

(56) References Cited

U.S. PATENT DOCUMENTS

| | | | |
|---|---|---|---|
| 5,758,823 A | 6/1998 | Glezer et al. | |
| 5,894,990 A | 4/1999 | Glezer et al. | |
| 5,988,522 A | 11/1999 | Glezer et al. | |
| 6,056,204 A | 5/2000 | Glezer et al. | |
| 6,123,145 A | 9/2000 | Glezer et al. | |
| 6,407,481 B1 * | 6/2002 | Takeuchi et al. | 310/324 |
| 6,457,654 B1 * | 10/2002 | Glezer et al. | 239/4 |
| 6,494,567 B2 * | 12/2002 | Murai | 347/71 |
| 6,566,789 B2 * | 5/2003 | Takeuchi et al. | 310/321 |
| 6,722,581 B2 | 4/2004 | Saddoughi | |
| 6,801,430 B1 | 10/2004 | Pokhama | |
| 6,933,662 B2 * | 8/2005 | Arbogast et al. | 310/366 |
| 7,202,591 B2 * | 4/2007 | Arbogast et al. | 310/332 |
| 7,263,837 B2 | 9/2007 | Smith | |
| 7,483,770 B2 * | 1/2009 | Meinders et al. | 700/300 |
| 7,608,989 B2 * | 10/2009 | Heydt et al. | 310/317 |
| 7,748,664 B2 * | 7/2010 | Boespflug et al. | 244/208 |
| 7,779,837 B2 * | 8/2010 | Gumaste et al. | 128/203.15 |
| 7,967,258 B2 * | 6/2011 | Smith et al. | 244/207 |
| 7,990,705 B2 * | 8/2011 | Bult et al. | 361/694 |

(Continued)

OTHER PUBLICATIONS

Utturkar, Y., Mittal, R., Rampunggoon, P., Cattafesta, L., "Sensitivity of Synthetic Jets to the Design of the Jet Cavity" Jan. 2002, 40th AIAA Aerospace Sciences Meeting & Exhibit.*

Goldfarb, M., Celanovic, N. "Modeling Piezoelectric Stack Actuators for Control of Micromanipulation" IEEE Control Systems, 1997 pp. 69-79.*

(Continued)

*Primary Examiner* — Devon Kramer
*Assistant Examiner* — Christopher Maxey
(74) *Attorney, Agent, or Firm* — Ziolkowski Patent Solutions Group, SC; Jean K. Testa

(57) ABSTRACT

A micro-electromechanical (MEM) synthetic jet actuator includes a semiconductor substrate having a cavity extending therethrough, such that a first opening is formed in a first surface of the semiconductor substrate and such that a second opening is formed in a second surface of the semiconductor substrate. A first flexible membrane is formed on at least a portion of the front surface of the semiconductor substrate and extends over the first opening. The first flexible membrane also includes an orifice formed therein aligned with the first opening. The MEM synthetic jet actuator also includes a second flexible membrane that is formed on at least a portion of the second surface of the semiconductor substrate and that extends over the second opening, and a pair of actuator elements coupled to the flexible membranes and aligned with the cavity to selectively cause displacement of the first and second flexible membranes.

13 Claims, 3 Drawing Sheets

U.S. PATENT DOCUMENTS

| | | | |
|---|---|---|---|
| 2006/0185822 A1* | 8/2006 | Glezer et al. | 165/80.3 |
| 2006/0196638 A1* | 9/2006 | Glezer et al. | 165/80.3 |
| 2007/0017659 A1* | 1/2007 | Brunschwiler et al. | 165/80.4 |
| 2008/0041574 A1* | 2/2008 | Arik et al. | 165/287 |
| 2008/0137289 A1* | 6/2008 | Arik et al. | 361/689 |
| 2008/0174620 A1* | 7/2008 | Tanner | 347/10 |
| 2008/0310110 A1* | 12/2008 | Arik et al. | 361/699 |
| 2010/0051721 A1* | 3/2010 | Arik et al. | 239/423 |
| 2010/0258274 A1* | 10/2010 | Van Der Tempel et al. | 165/84 |
| 2011/0070109 A1* | 3/2011 | Kanai et al. | 417/410.2 |

OTHER PUBLICATIONS

Arik, "An investigation into feasibility of impingement heat transfer and acoustic abatement of meso scale synthetic jets," Applied Thermal Engineering, 2007, vol. 27, pp. 1483-1494.

Utturkar et al., "An Experimental and Computational Heat Transfer Study of Pulsating Jets," Journal of Heat Transfer, Jun. 2008, vol. 130.

Garg et al., "Meso Scale Pulsating Jets for Electronics Cooling".

* cited by examiner

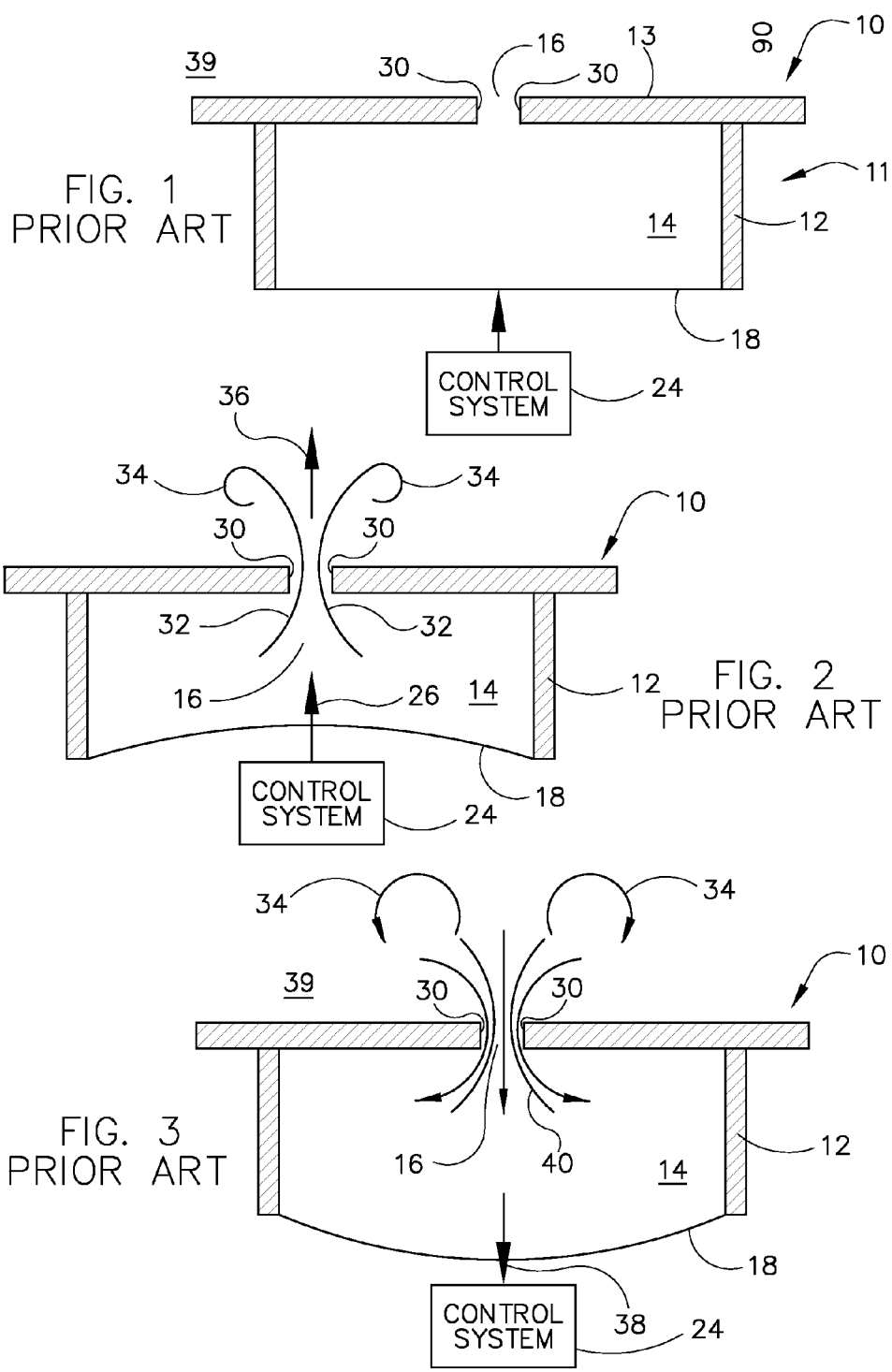

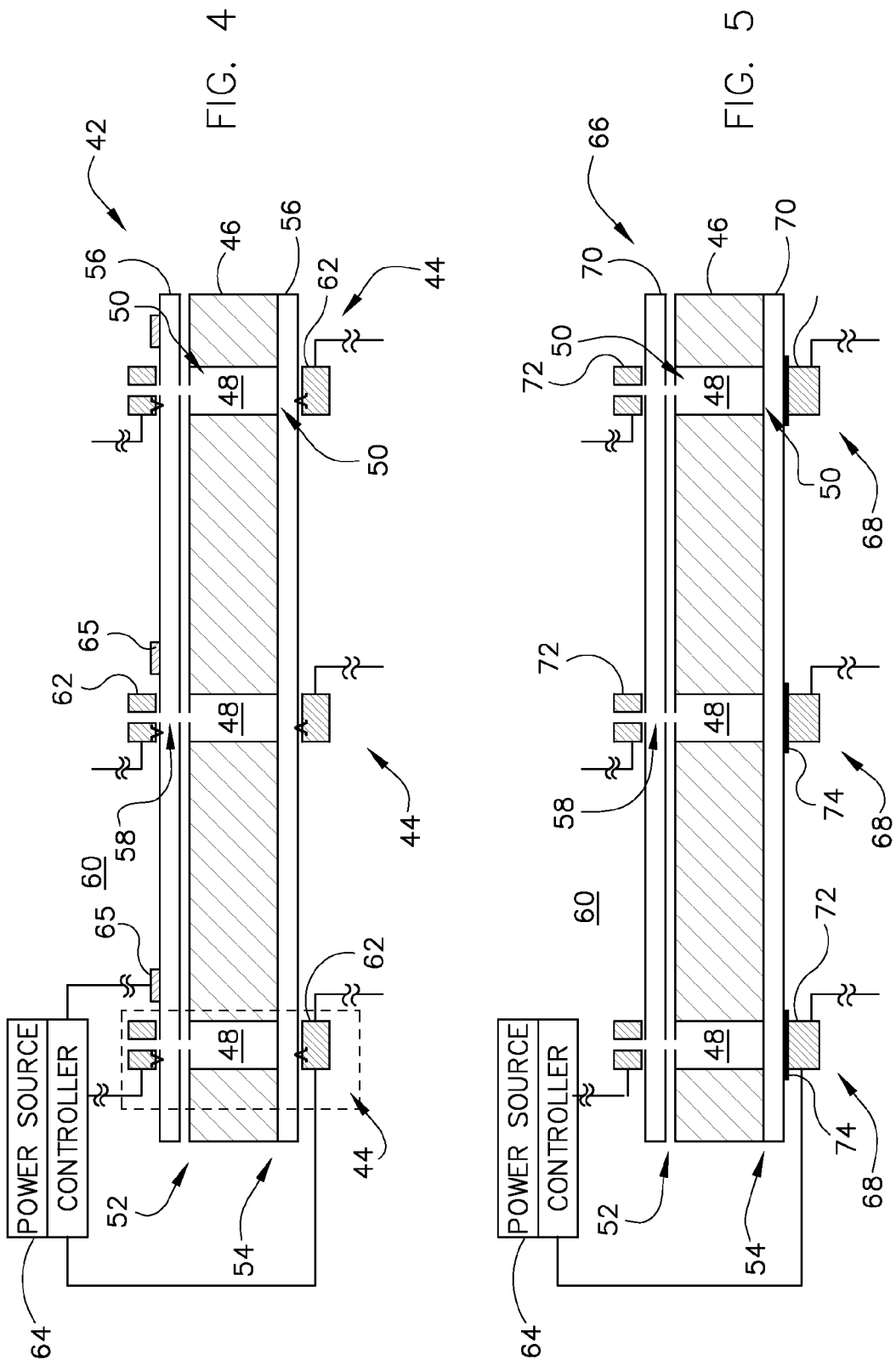

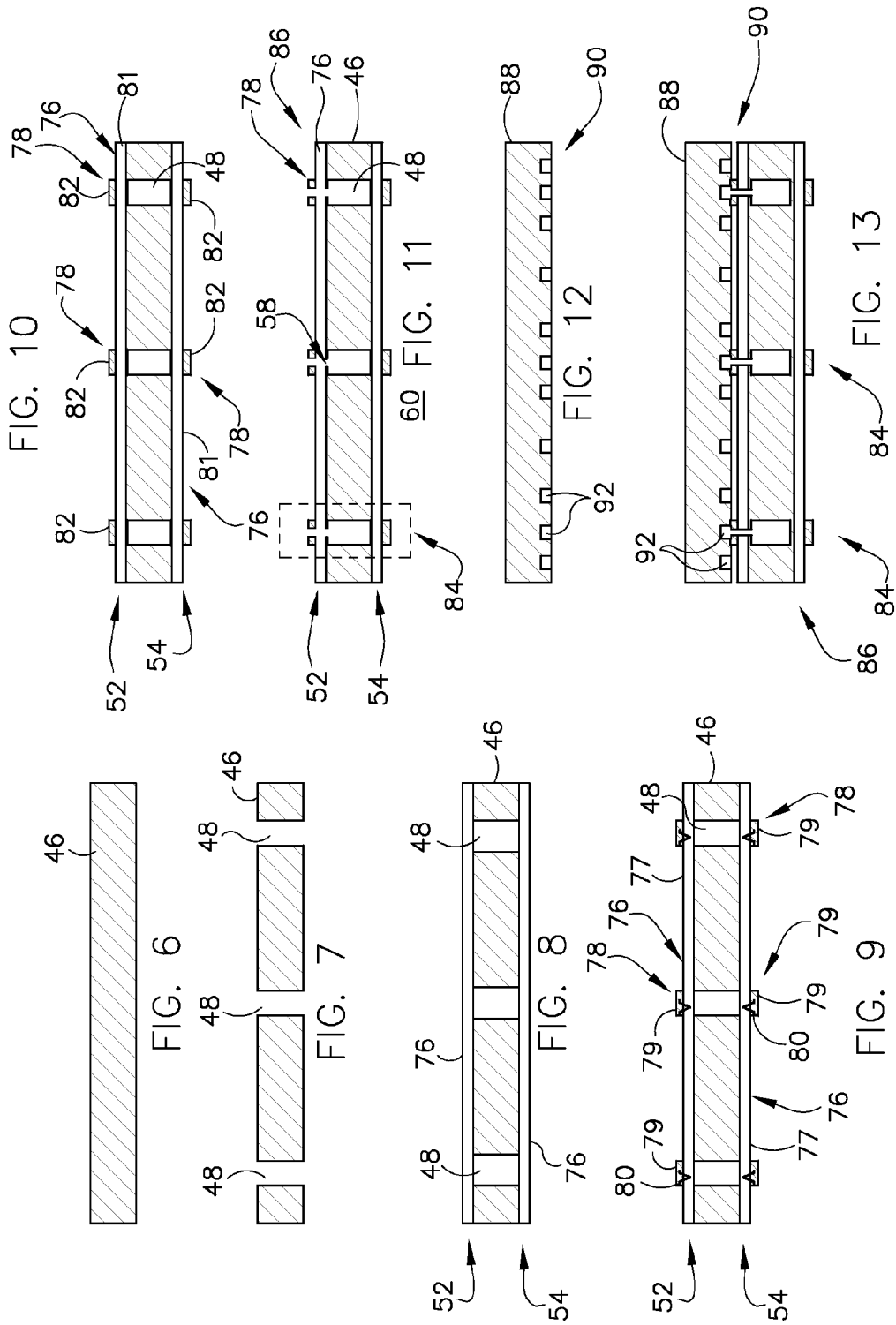

SYSTEM AND METHOD FOR MINIATURIZATION OF SYNTHETIC JETS

BACKGROUND OF THE INVENTION

Embodiments of the invention relate generally to synthetic jets and, more particularly, to arrays of micro-electromechanical (MEM) synthetic jets.

Synthetic jet actuators are a widely-used technology that generates a synthetic jet of fluid to influence the flow of that fluid over a surface. A typical synthetic jet actuator comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, a control system is used to create time-harmonic motion of the volume changing mechanism. As the mechanism decreases the chamber volume, fluid is ejected from the chamber through the orifice. As the fluid passes through the orifice, sharp edges of the orifice separate the flow to create vortex sheets that roll up into vortices. These vortices move away from the edges of the orifice under their own self-induced velocity. As the mechanism increases the chamber volume, ambient fluid is drawn into the chamber from large distances from the orifice. Since the vortices have already moved away from the edges of the orifice, they are not affected by the ambient fluid entering into the chamber. As the vortices travel away from the orifice, they synthesize a jet of fluid, i.e., a "synthetic jet."

One major use for synthetic jets is in the cooling of heat-producing bodies, which is a concern in many different technologies. One such example is the use of synthetic jets in the cooling of integrated circuits in single- and multi-chip modules. A major challenge in the design and packaging of state-of-the-art integrated circuits in single- and multi-chip modules is the ever increasing demand for high power density heat dissipation. While current cooling techniques can dissipate about 4 W/cm$^2$, the projected industrial cooling requirements in the coming years are expected to be 10 to 40 W/cm$^2$ and higher. Furthermore, current cooling technologies for applications involving high heat flux densities are often complicated, bulky, and costly.

Traditionally, this need has been met by using forced convective cooling mechanisms, such as fans, which provide global overall cooling. However, what is often required is pinpoint cooling of a particular component or set of components rather than global cooling. Furthermore, magnetic-motor-based fans may generate electromagnetic interference, which can introduce noise into the system.

In applications where there is a heat-producing body in a bounded volume, issues arise with respect to cooling the body. Generally, cooling by natural convection is the only method available since forced convection would require some net mass injection into the system, and subsequent collection of this mass. The only means of assistance would be some mechanical fan wholly internal to the volume. However, often this requires large moving parts in order to have any success in cooling the heated body. These large moving parts naturally require high power inputs and are not practically implemented. Conversely, simply allowing natural convective cooling to carry heat from the body producing it into the fluid of the volume and depending on the housing walls to absorb the heat and emit it outside the volume, is also an inadequate means of cooling.

Accordingly, there is a need for a system and method for providing cooling of integrated circuits in single- and multi-chip modules. There is a further need for such a system to be small and provide effective cooling via convection so as to be useable in a bounded volume.

BRIEF DESCRIPTION OF THE INVENTION

Embodiments of the invention overcome the aforementioned drawbacks by providing a system and method of providing an array of micro-electromechanical (MEM) synthetic jets. The micro-electromechanical (MEM) synthetic jets are formed on a surface of a semiconductor chip to provide cooling thereto.

In accordance with one aspect of the invention, a micro-electromechanical (MEM) synthetic jet actuator includes a semiconductor substrate having a cavity extending there through such that a first opening is formed in a first surface of the semiconductor substrate and such that a second opening is formed in a second surface of the semiconductor substrate. The MEM synthetic jet actuator also includes a first flexible membrane formed on at least a portion of the front surface of the semiconductor substrate and extending over the first opening, wherein the first flexible membrane comprises an orifice formed therein and aligned with the first opening. The MEM synthetic jet actuator further includes a second flexible membrane formed on at least a portion of the second surface of the semiconductor substrate and extending over the second opening and a pair of actuator elements, each actuator element coupled to a respective flexible membrane and aligned with the cavity to selectively cause displacement of the first and second flexible membranes. Vibration of the first and second flexible membranes causes a change in cavity volume such that an ambient fluid is drawn into the cavity through the orifice when the cavity volume is expanded and such that the ambient fluid is expelled from the orifice when the cavity volume is decreased, the expelled ambient fluid forming a synthetic jet stream.

In accordance with another aspect of the invention, a method of manufacturing a synthetic jet actuator includes providing a layer of semiconductor material and etching a cavity in the layer of semiconductor material, the cavity extending from a front surface of the layer of semiconductor material to a back surface of the layer of semiconductor material. The method also includes applying a flexible membrane to each of the front surface and the back surface of the layer of semiconductor material and forming an actuator element on an outward facing surface of each of the flexible membranes, each actuator element configured to cause displacement of the flexible membrane when an electric charge is applied thereto, thereby causing a change in volume within the cavity. The method further includes the step of forming an orifice in-line with the cavity and through the flexible membrane applied to the front surface such that the cavity is in fluid communication with a surrounding ambient environment.

In accordance with yet another aspect of the invention, a synthetic jet actuator array includes a semiconductor substrate and a plurality of synthetic jet actuators formed in the semiconductor substrate. Each of the plurality of synthetic jet actuators includes a cavity extending through the semiconductor substrate such that a front opening is formed in a front surface of the semiconductor substrate and such that a back opening is formed in a back surface of the semiconductor substrate, a front laminate film formed on the front surface of the semiconductor substrate and extending over the front opening, and a back laminate film formed on the back surface of the semiconductor substrate and extending over the back opening. Each of the synthetic jet actuators also includes a pair of actuator elements each of which is placed on a respective laminate film and aligned with the cavity to selectively cause displacement of the front and back laminate films, and an orifice formed in one of the front laminate film and the back laminate film and aligned with the cavity, the orifice extending through the actuator element placed on the one of the front laminate film and the back laminate film.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 1 is a cross-section of a prior art zero net mass flux synthetic jet actuator with a control system.

FIG. 2 is a cross-section of the synthetic jet actuator of FIG. 1 depicting the jet as the control system causes the diaphragm to travel inward, toward the orifice.

FIG. 3 is a cross-section of the synthetic jet actuator of FIG. 1 depicting the jet as the control system causes the diaphragm to travel outward, away from the orifice.

FIG. 4 is a schematic cross-sectional side view of a synthetic jet actuator array according to an embodiment of the invention.

FIG. 5 is a schematic cross-sectional side view of a synthetic jet actuator array according to another embodiment of the invention.

FIGS. 6-13 are schematic cross-sectional side views of a synthetic jet actuator array during various stages of a manufacturing/fabrication process according to an embodiment of the invention.

DETAILED DESCRIPTION OF THE PREFERRED EMBODIMENT

The present invention provides for a system and method of providing an array of micro-electromechanical (MEM) synthetic jets. The micro-electromechanical (MEM) synthetic jets are formed on a surface of a semiconductor chip to provide cooling thereto.

Referring to FIGS. 1-3, a synthetic jet actuator 10 as known in the art, and the operation thereof, is shown. The synthetic jet actuator 10 includes a housing 11 defining and enclosing an internal chamber 14. The housing 11 and chamber 14 can take virtually any geometric configuration, but for purposes of discussion and understanding, the housing 11 is shown in cross-section in FIG. 1 to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16. Alternatively, a piezoelectric actuator could be attached to the diaphragm 18. The control system would, in that case, cause the piezoelectric actuator to vibrate and thereby move the diaphragm 18 in time-harmonic motion.

The operation of the synthetic jet actuator 10 is described with reference to FIGS. 2 and 3. FIG. 2 depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

FIG. 3 depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

Many applications of synthetic jet actuators may require that the synthetic jet used be of very small size, such as to create a macro-fluid flow and/or generate a fluid flow in a bounded volume. To accommodate this requirement, a synthetic jet actuator can be micro-fabricated to form a miniaturized, micro-electromechanical (MEM) synthetic jet actuator. Referring now to FIG. 4, an array 42 of MEM synthetic jet actuators 44 according to one embodiment of the invention is shown. Each MEM synthetic jet actuator 44 includes a substrate 46 that is formed of a semiconductor material, such as a silicon-based material. Formed in the semiconductor substrate 46 is a cavity 48 corresponding to each synthetic jet actuator 44. Each cavity 48 is formed through the semiconductor substrate 46 such that openings 50 are formed in a front surface 52 of the substrate 46 and a back surface 54 of the substrate 46. As shown in FIG. 4, the openings 50 of the cavity 48 are vertically aligned in semiconductor substrate 46.

Positioned over the openings 50 on the front surface 52 of the substrate 46 and the back surface 54 of the substrate 46 is a flexible membrane or laminate film 56. In an exemplary embodiment of the invention, flexible membranes 56 are formed as piezoelectric films that are laminated onto the semiconductor substrate 46. The piezoelectric films 56 can be comprised of, for example, polyvinylidine fluoride (PVDF). As shown in FIG. 4, orifices 58 are formed through either the front or back surface piezoelectric film 56 such that each cavity 48 is in fluid communication with the ambient environment 60. While orifices 58 are shown as being formed in the flexible membrane 56 formed on the front surface 52 of the semiconductor substrate 46, it is also envisioned that orifices 58 could instead be formed in the flexible membrane 56 on the back surface 54 of the semiconductor substrate 46.

The orifices 58 are sized to create a macro-fluid flow therethrough and can, for example, have a diameter of 100 microns or less.

Positioned on the piezoelectric films 56 on the front and back surface 52, 54 of the semiconductor substrate 46 are actuator elements 62. In the embodiment shown in FIG. 4, actuator elements 62 comprise electrodes configured to receive a driver signal (i.e., an electric charge) from a controller/power source combination 64 (i.e., synthetic jet drive, jet driver). The electrodes 62 are patterned and etched so as to be electrically connected to piezoelectric films 56 to transfer the electric charge thereto. As shown in FIG. 4, according to an embodiment of the invention, each electrode 62 is positioned in-line with a cavity 48 in semiconductor substrate 46. A hole is formed through each electrode 62 such that orifice 58 extends therethrough. In operation, electric charges are sent to one or both of the electrodes 62 of each synthetic jet actuator 44 to selectively control displacement (i.e., vibration) of the piezoelectric films 56. That is, electric charges can be sent to one or both of the electrodes 62 of each synthetic jet actuator 44, as determined by the controller/power source 64, so as to cause the piezoelectric films 56 to vibrate and move in time-harmonic motion. The time-harmonic motion can be in the form of a Helmholtz frequency or a structural resonant frequency. The vibration of one or both of the piezoelectric films 56 causes a change in volume within cavity 48 of a synthetic jet actuator 44, such that an ambient fluid (e.g., air or a dielectric fluid, such as FC-72 or HFE-7100) from the surrounding environment 60 is drawn into the cavity 48 through the orifice 58 when the volume of the cavity 48 is expanded and such that the ambient fluid is expelled from the orifice 58 when the volume of the cavity 48 is decreased, with the expelled ambient fluid forming a synthetic jet stream. It is recognized that, for each synthetic jet actuator 44, if both the front and back surface piezoelectric films 56 are actuated and caused to vibrate in response to electric charges from the electrodes 62, the volume and velocity of the synthetic jet stream expelled through orifice 58 is increased. That is, in an embodiment where both the front and back surface piezoelectric films 56 are actuated and caused to vibrate, the volume and velocity of the ambient fluid expelled in the synthetic jet stream is increased approximately 30% over a synthetic jet stream that would be formed via vibration of the piezoelectric film 56 on only one of the front and back surface 52, 54 of the semiconductor substrate 46.

Additionally, according to one embodiment of the invention, temperature sensing elements 65, such as metal thermistors, can be deposited and patterned in close proximity to each of the synthetic jet actuators 44. These sensing elements 65 could be scanned with addressable logic and the local temperatures read. Using this information, the controller/power source combination 64 for each synthetic jet actuator 44 could be adjusted to compensate for hot spots on the device to be cooled, such as by increasing drive frequency or amplitude of localized jet actuators to increase cooling performance. This results in more uniform cooling and, in some cases, reduced power consumption as certain other synthetic jet actuators 44 may be shut down during certain periods.

Referring now to FIG. 5, according to another embodiment of the invention, an array 66 of synthetic jet actuators 68 is formed that includes a substrate 46 that is formed of a semiconductor material and a cavity 48 formed in the substrate corresponding to each synthetic jet actuator 68. A flexible membrane 70 is positioned over openings 50 on the front surface 52 of the substrate 46 and the back surface 54 of the substrate 46 and is formed as a polyimide film. For example, the polyimide film 70 can comprise a Kapton film laminated onto the front and back surfaces 52, 54 of the semiconductor substrate 46. Orifices 58 are formed through one of the polyimide films 70 such that each cavity 48 is in fluid communication with the ambient environment. For each synthetic jet actuator 68, actuator elements 72 are positioned on the polyimide films 70 in the form of piezoelectric elements or discs. This may be done using thin film deposition techniques, such as sputtering or evaporation, followed by polling of the film. The films may be either subtractively processed using lithography and etching techniques, or directly shadow masked. Piezoelectric elements 72 are configured to receive an electric charge from a controller/power source 64, and undergo mechanical stress and/or strain responsive to the charge. The stress/strain of piezoelectric elements 72 causes displacement of polyimide films 70, which when controlled by way of controller/power source 64 can cause a time-harmonic motion or vibration of polyimide films 70. It is recognized that, for each synthetic jet actuator 68, the piezoelectric elements 72 on the front and back surfaces 52, 54 of the semiconductor substrate 46 can be selectively controlled to cause vibration of one or both of the polyimide films 70 so as to control the volume and velocity of the synthetic jet stream expelled through the orifice 58.

Referring still to FIG. 5, in one embodiment of the invention, a backer structure 74 is positioned between the polyimide film 70 and at least some of the actuator elements 72. Backer structure 74 functions to provide improved adhesion between the polyimide film 70 and the actuator elements 72, as the backer structure 74 has a modulus of elasticity value between that of the polyimide film and the actuator element materials. It is envisioned that the backer structure 74 would have a modulus of elasticity in a range of from about 10 Mpsi to about 100 Mpsi. It is also recognized that a backer element 74 could also be implemented into the synthetic jet actuator shown in FIG. 4.

In a further embodiment of the synthetic jet actuator 68 shown in FIG. 5, it is recognized that temperature sensing elements (not shown), such as those shown and described with respect to FIG. 4, could also be implemented. The temperature sensing elements would be deposited and patterned in close proximity to each of the synthetic jet actuators 68 and connected to controller/power source combination 64, which could control electric charges sent to the synthetic jet actuators 68 (i.e., increasing drive frequency or amplitude of the charges) based on feedback from the temperature sensing elements.

Referring now to FIGS. 6-13, a technique for manufacturing/fabricating a synthetic jet actuator, and an array thereof, is illustrated. As shown in FIG. 6, a wafer 46 of semiconductor material is provided, such as a silicon-based wafer. For generating an array of synthetic jet actuators, a plurality of cavities 48 are first etched into the semiconductor wafer 46, as shown in FIG. 7. In one embodiment, cavities 48 are anisotropically etched using a 20% potassium hydroxide solution in water at about 60° C. After etching the plurality of cavities 48 in semiconductor wafer 46, a flexible membrane 76 is applied to each of the front and back surfaces 52, 54 of the wafer 46, as shown in FIG. 8. The flexible membranes 76 are in the form of laminate films that are applied to semiconductor wafer 46 via an adhesive. In one embodiment of the invention, and as set forth with respect to FIG. 4 above, the laminate films 76 are comprised of a piezoelectric material so as to form piezoelectric films. The piezoelectric films can be comprised of, for example, polyvinylidine fluoride (PVDF) and acts to deform (i.e., undergo stress/strain) when an electric charge is applied thereto. It is also envisioned that in another embodiment, as set forth above with respect to FIG. 5, that the laminate films can be comprised of a polyimide material (e.g., Kapton).

Referring now to FIGS. 9 and 10, after flexible membrane 76 has been laminated on and adhered to the front and back surfaces 52, 54 of semiconductor substrate 46, as shown in FIG. 8, a plurality of actuator elements 78 are placed on or formed on the laminate films 76. Actuator elements 78 are positioned vertically in-line with cavities 48 formed in semiconductor substrate 46 so as to cause displacement and vibration in the laminate films 76 that are present over a cavity 48. In one embodiment of the invention, and as shown in FIG. 9, when laminate films 76 are in the form of piezoelectric films 77 (see FIG. 2), the actuator elements 78 comprise metalized electrodes 79. The electrodes 79 can be applied to piezoelectric films 77 via a sputtering process and subsequently patterned and etched to form an interconnect 80 that electrically connects each electrode 79 to the piezoelectric films 77 to transfer an electric charge thereto. As each electrode 79 is separate and distinct from other electrodes, each can be separately controlled to send an electric charge to the piezoelectric films 77, thereby controlling vibration of the films. Specifically, the electrodes 79 can be selectively activated to control the vibration of the piezoelectric films 77 over desired cavities 48 in the semiconductor substrate 46.

Alternatively, when laminate film 76 is in the form of a polyimide film 81 (as in FIG. 3), the actuator elements 78 comprise piezoelectric elements 82, as shown in FIG. 10. That is, in one embodiment of the invention, piezoelectric ceramic discs 82 having a converse piezoelectric effect can be placed on polyimide films 81 over each cavity 48 in the semiconductor substrate 46 to cause displacement of the polyimide films 81. The piezoelectric ceramic discs 82 can be comprised of, for example, lead zirconate titanate (PZT). Additionally, piezoelectric ceramic discs 82 may be formed on polyimide films 81 using thin film deposition techniques such as sputtering or evaporation, followed by polling of the film. The films may be either subtractively processed using lithography and etching techniques, or directly shadow masked. Upon application of an electric charge thereto, the piezoelectric elements/discs 82 are configured to undergo mechanical stress and/or strain responsive to the charge, thereby causing selective displacement of the polyimide films 81 in the form of a time-harmonic motion or vibration. Specifically, and similar to that set forth above with respect to FIG. 9, each piezoelectric disc 82 can be separately controlled (i.e., an electric charge sent thereto) to cause stress/strain therein, thereby causing vibration in the polyimide films 81 and displacement thereof. The polyimide films 81 can therefore be controlled to cause vibration over desired cavities 48 in the semiconductor substrate 46.

Referring now to FIG. 11, in a next step of the manufacturing/fabrication technique, a plurality of orifices 58 are formed in the laminate film 76 (i.e., flexible membrane) on either the front or back surface 52, 54 of the semiconductor substrate 46. As shown in FIG. 11, the orifices 58 are formed in the front surface laminate film 76 and in-line with the cavities 48 in the semiconductor substrate 46. As further shown in FIG. 11, a hole is formed in each actuator element 78 placed on laminate films 76, such that the orifices 58 extend through the actuator elements 78. In an exemplary embodiment of the invention, the orifices 58 are formed through the actuator elements 78 and laminate film 76 by way of laser drilling, although it is envisioned that other suitable techniques could also be employed. By laser drilling orifices 58 through actuator elements 78 and laminate film 76, the cavity 48 of each synthetic jet actuator 84 in the array 86 of synthetic jet actuators is placed in fluid communication with the surrounding ambient environment 60. While shown in FIG. 11 as being formed through actuator elements 78 and laminate film 76, it is envisioned that the orifices 58 could be formed just through the laminate film 76. That is, in another embodiment of the invention, the actuator element 78 on the front surface laminate film 76 (for example) in each synthetic jet 84 could be placed off-center from the cavity 48. The orifice 58 could then be formed adjacent the actuator element 78 and extend through only the laminate film 76, placing the cavity 48 in fluid communication with the surrounding ambient environment 60. The actuator elements 78 can then be selectively activated to control the vibration of the laminate films 76 over desired cavities 48 in the semiconductor substrate 46, thereby controlling individual synthetic jet actuators 84 in the array 86 and creating synthetic jet streams of fluid expelled through orifices 58 at desired locations.

Referring now to FIG. 12, it is recognized that the formed array 86 of synthetic jet actuators 84 can be placed adjacent to and joined with a device wafer 88 (e.g., integrated circuit (IC) chip) to provide cooling thereto. In preparation for attaching the synthetic jet actuator array 86 to the device wafer 88, a backside 90 of the device wafer 88 is etched to form a plurality of depressions 92 therein, as shown in FIG. 12. Referring to FIG. 13, it is shown that, upon etching of a backside 90 of the device wafer 88, the synthetic jet actuator array 86 can be affixed thereto, such as via a lamination process in which an adhesive is employed to secure the synthetic jet actuator array 86 to the device wafer 88. It is envisioned that the depressions 92 in the backside 90 of the device wafer 88 are etched in an arrangement corresponding to the location of known "hot spots" in the device wafer 88 that require cooling. A plurality of the interconnected or independent depressions 92 can be aligned with synthetic jet actuators 84 in the array 86 so as to direct synthetic jet streams of fluid toward the hot spots, thus maximizing the convective cooling provided by the synthetic jet actuator array 86.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, a micro-electromechanical (MEM) synthetic jet actuator includes a semiconductor substrate having a cavity extending there through such that a first opening is formed in a first surface of the semiconductor substrate and such that a second opening is formed in a second surface of the semiconductor substrate. The MEM synthetic jet actuator also includes a first flexible membrane formed on at least a portion of the front surface of the semiconductor substrate and extending over the first opening, wherein the first flexible membrane comprises an orifice formed therein and aligned with the first opening. The MEM synthetic jet actuator further includes a second flexible membrane formed on at least a portion of the second surface of the semiconductor substrate and extending over the second opening and a pair of actuator elements, each actuator element coupled to a respective flexible membrane and aligned with the cavity to selectively cause displacement of the first and second flexible membranes. Vibration of the first and second flexible membranes causes a change in cavity volume such that an ambient fluid is drawn into the cavity through the orifice when the cavity volume is expanded and such that the ambient fluid is expelled from the orifice when the cavity volume is decreased, the expelled ambient fluid forming a synthetic jet stream.

According to another embodiment of the invention, a method of manufacturing a synthetic jet actuator includes providing a layer of semiconductor material and etching a cavity in the layer of semiconductor material, the cavity extending from a front surface of the layer of semiconductor material to a back surface of the layer of semiconductor material. The method also includes applying a flexible membrane to each of the front surface and the back surface of the layer of semiconductor material and forming an actuator element on an outward facing surface of each of the flexible membranes, each actuator element configured to cause displacement of the flexible membrane when an electric charge is applied thereto, thereby causing a change in volume within the cavity. The method further includes the step of forming an orifice in-line with the cavity and through the flexible membrane applied to the front surface such that the cavity is in fluid communication with a surrounding ambient environment.

According to yet another embodiment of the invention, a synthetic jet actuator array includes a semiconductor substrate and a plurality of synthetic jet actuators formed in the semiconductor substrate. Each of the plurality of synthetic jet actuators includes a cavity extending through the semiconductor substrate such that a front opening is formed in a front surface of the semiconductor substrate and such that a back opening is formed in a back surface of the semiconductor substrate, a front laminate film formed on the front surface of the semiconductor substrate and extending over the front opening, and a back laminate film formed on the back surface of the semiconductor substrate and extending over the back opening. Each of the synthetic jet actuators also includes a pair of actuator elements each of which is placed on a respective laminate film and aligned with the cavity to selectively cause displacement of the front and back laminate films, and an orifice formed in one of the front laminate film and the back laminate film and aligned with the cavity, the orifice extending through the actuator element placed on the one of the front laminate film and the back laminate film.

What is claimed as new and desired to be protected by Letters Patent of the United States is:

1. A micro-electromechanical (MEM) synthetic jet actuator comprising:
   a semiconductor substrate having a cavity extending therethrough such that a first opening is formed in a first surface of the semiconductor substrate and such that a second opening is formed in a second surface of the semiconductor substrate;
   a first flexible membrane formed on at least a portion of the first surface of the semiconductor substrate and extending over the first opening, wherein the first flexible membrane comprises an orifice formed therein and aligned with the first opening;
   a second flexible membrane formed on at least a portion of the second surface of the semiconductor substrate and extending over the second opening; and
   a pair of actuator elements, each of the actuator elements coupled to a respective flexible membrane to selectively cause displacement of the first and second flexible membranes;
   wherein vibration of the first and second flexible membranes causes a change in cavity volume such that an ambient fluid is drawn into the cavity through the orifice when the cavity volume is expanded and such that the ambient fluid is expelled from the orifice when the cavity volume is decreased, the expelled ambient fluid forming a synthetic jet stream; and
   wherein the actuator element on the first flexible membrane is positioned off-center from the cavity, adjacent to the orifice formed in the first flexible membrane.

2. The MEM synthetic jet actuator of claim 1 wherein the first and second flexible membranes comprise a piezoelectric film.

3. The MEM synthetic jet actuator of claim 2 wherein each of the actuator elements comprises an electrode configured to actuate the piezoelectric film coupled thereto when an electric charge is applied to the electrode.

4. The MEM synthetic jet actuator of claim 1 wherein the first and second flexible membranes comprise a polyimide film.

5. The MEM synthetic jet actuator of claim 4 wherein each of the actuator elements comprises a piezoelectric element configured to displace the polyimide film coupled thereto when an electric charge is applied to the piezoelectric element.

6. The MEM synthetic jet actuator of claim 1 further comprising a backer structure formed on at least one of the first flexible membrane and the second flexible membrane and positioned between the at least one of the first flexible membrane and the second flexible membrane and the actuator element coupled thereto.

7. The MEM synthetic jet actuator of claim 1 wherein the first and second flexible membranes vibrate at one of a Helmholtz frequency and a structural resonant frequency to cause displacement of the first and second flexible membranes in time-harmonic motion in response to electric charges received from the actuator elements.

8. The MEM synthetic jet actuator of claim 1 further comprising:
   a jet driver configured to selectively transmit a driver signal to each of the actuator elements to cause vibration thereof; and
   a temperature sensing element positioned adjacent the synthetic jet actuator and configured to sense a temperature of an area in proximity to the synthetic jet actuator and send feedback to the jet driver that includes the sensed temperature;
   wherein the jet driver is configured to vary at least one of an amplitude and frequency of the driver signal transmitted to the pair of actuator elements based on the sensed temperature feedback.

9. The MEM synthetic jet actuator of claim 1 wherein a diameter of the orifice is less than approximately 100 microns.

10. A synthetic jet actuator array comprising:
   a semiconductor substrate;
   a plurality of synthetic jet actuators formed in the semiconductor substrate, each of the plurality of synthetic jet actuators comprising:
      a cavity extending through the semiconductor substrate such that a front opening is formed in a front surface of the semiconductor substrate and such that a back opening is formed in a back surface of the semiconductor substrate;
      a front laminate film formed on the front surface of the semiconductor substrate and extending over the front opening;

a back laminate film formed on the back surface of the semiconductor substrate and extending over the back opening;

a pair of actuator elements, each of the actuator elements placed on a respective laminate film to selectively cause displacement of the front and back laminate films; and an orifice formed in one of the front laminate film and the back laminate film and aligned with the cavity; and an adhesive applied to the one of the front laminate film and the back laminate film having the orifices formed therein to secure the synthetic jet actuator array to an integrated circuit (IC) chip to be cooled, with the IC chip secured to the synthetic jet actuator array such that each of the plurality of synthetic jet actuators is aligned with a depression formed in a backside of the IC chip so as to provide cooling to a plurality of desired locations in the IC chip, wherein the actuator element on the laminate film comprising the orifice is positioned off-center from the cavity, adjacent to the orifice formed in the laminate film.

11. The synthetic jet actuator array of claim 10 wherein each of the front and back laminate films comprises a piezoelectric film and wherein each of the actuator elements comprises an electrode interconnected to each of the actuator elements' respective piezoelectric film to supply an electric charge thereto, thereby causing displacement of the piezoelectric film.

12. The synthetic jet actuator array of claim 10 wherein each of the front and back laminate films comprises a polyimide film and wherein each of the actuator elements comprises a piezoelectric element positioned on each of the actuator elements' polyimide film, the piezoelectric elements configured to displace the polyimide films when an electric charge is applied thereto.

13. The synthetic jet actuator array of claim 10 wherein each of the plurality of synthetic jet actuators further comprises:

a controller power source combination configured to selectively transmit an electric charge to each of the actuator elements to cause vibration thereof; and a temperature sensing element positioned adjacent the synthetic jet actuator and configured to sense a temperature of an area in proximity to the synthetic jet actuator and send feedback to the controller power source combination that includes the sensed temperature;

wherein the controller power source combination is configured to vary at least one of an amplitude and frequency of the electric charge transmitted to the pair of actuator elements based on the sensed temperature feedback.

* * * * *